United States Patent [19]

Rockett, Jr.

[11] Patent Number: 4,508,975
[45] Date of Patent: Apr. 2, 1985

[54] PULSE DURATION MODULATOR USING CHARGE COUPLED DEVICES

[75] Inventor: Leonard R. Rockett, Jr., Washington, D.C.

[73] Assignee: RCA Corporation, New York, N.Y.

[21] Appl. No.: 426,098

[22] Filed: Sep. 28, 1982

[51] Int. Cl.³ .................. H03K 9/02; H03K 11/00
[52] U.S. Cl. .................... 307/261; 307/265; 307/352; 328/54; 328/58; 357/24; 377/62; 377/63
[58] Field of Search .............. 307/530, 352, 261, 265; 328/28, 31, 54, 58, 135; 377/61, 62, 63, 71; 333/165, 166; 357/24

[56] References Cited

U.S. PATENT DOCUMENTS

| | | | |
|---|---|---|---|
| 4,255,725 | 3/1981 | Berger et al. | 333/166 X |
| 4,275,354 | 6/1981 | Suematsu et al. | 328/58 |
| 4,277,702 | 7/1981 | Hamilton et al. | 307/530 X |
| 4,315,164 | 2/1982 | Kub et al. | 377/62 |
| 4,356,463 | 10/1982 | Gonin et al. | 333/166 X |
| 4,435,730 | 3/1984 | Bendell et al. | 333/165 X |
| 4,443,774 | 4/1984 | Luder et al. | 333/166 X |

Primary Examiner—Stanley D. Miller
Assistant Examiner—D. R. Hudspeth
Attorney, Agent, or Firm—Joseph S. Tripoli; George E. Haas; Allen LeRoy Limberg

[57] ABSTRACT

Pulse-duration-modulated signal is generated from samples of an analog signal voltage in a CCD device by fill-and-spill input of charge into the CCD device, scooping of fixed unit charge to generate a pulse train with pulses in a number proportional to the sample analog voltage, and box-car detection. The box-car detection uses a floating electrode, the resetting of which is selectively inhibited until just past the last pulse in the train that equals or exceeds the potential midway between the potentials defining logic ZERO and logic ONE.

9 Claims, 9 Drawing Figures

PULSE DURATION MODULATOR USING CHARGE COUPLED DEVICES

The present invention relates to the sampling of analog signals and the subsequent conversion of the samples to durations of uniform height pulses.

It is often desirable to convert variable-amplitude analog input signals to fixed-amplitude signals so that they may be handled with standard digital gates. This is the case in certain monolithic integrated circuits which use metal-oxide-semiconductor field effect transistors (MOSFETs). The conversion should be done with apparatus that can be constructed in the integrated circuit using the same process steps that are used to construct the MOSFET circuits.

The present invention uses charge-coupled device technology in the conversion of the pulse-amplitude-modulated (PAM) signals generated by regularly sampling an analog input signal to pulse-duration-modulated (PDM) signals. The PDM signals are constant height and can be used as input signals for conventional digital circuits.

Figure 1:
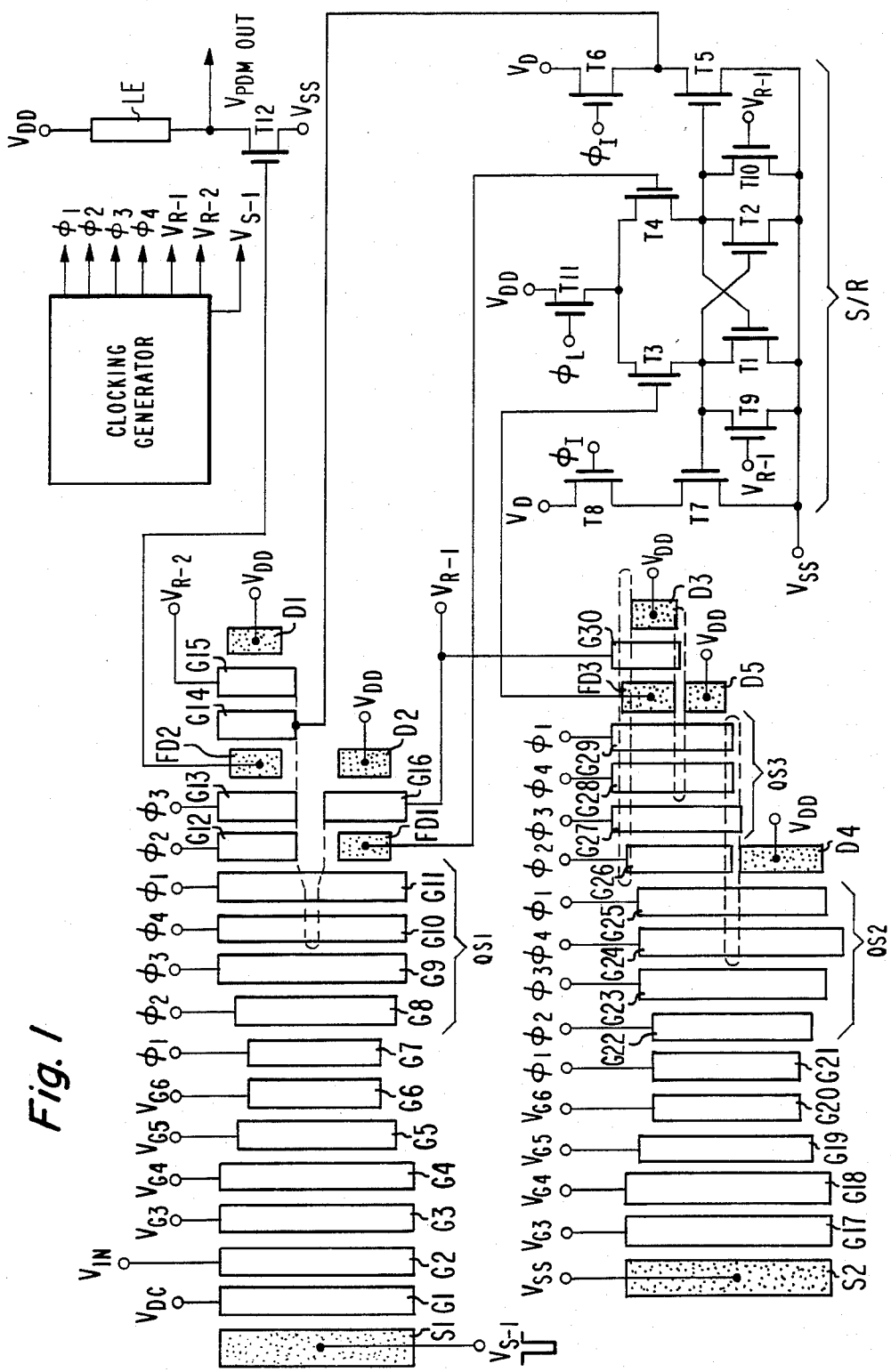
FIG. 1 is a schematic diagram of a CCD pulse duration modulator embodying the present invention.

FIGS. 3(a)–(g) are a time-lapse sequence of potential profiles descriptive of the operation of the input portions of the FIG. 1 pulse duration modulator;

In FIG. 1 an analog signal voltage $V_{IN}$ is used to modulate pulse duration in a PDM output voltage $V_{PDM}$ developed across a load element LE, which may by way of example be a self-biased field effect transistor (FET). A clocking generator CG shown in FIG. 1 may be constructed using FET's within the confines of the same monolithic integrated circuit as the FET circuitry (such as sense/refresh circuit S/R) and the charge transfer circuitry shown specifically. The same integrated circuit will customarily, it is envisioned, further contain digital circuitry, not shown in FIG. 1, utilizing $V_{PDM}$ as an input voltage.

The charge transfer devices, by way of example, use four-phase clocking, the four successive phases of clocking voltage being identified as $\phi_1$, $\phi_2$, $\phi_3$ and $\phi_4$. The gate electrode structures, which overlie an insulating layer on the surface of the semiconductor substrate, are shown as rectangles (which in some cases are suggestive of scale, but which are often not to scale). The CCD's are assumed to be of the surface channel type with p substrate (n-channel) for purposes of illustration but may be surface-channel or buried channel structures of either conductivity type, and any of the conventional electrode structures (single layer, double layer, triple layer, etc.) may be used. In a first of these charge transfer devices, shown at middle left of FIG. 1, a source diffusion S1 and gate electrode structures G1, G2, G3 are used together to implement introduction of analog charge, proportional to $V_{IN}$, into the device by fill-and-spill technique. Gate electrode structures G3, G4 and G5 are used together in implementing the creation of a holding well for this analog charge. Gate electrode structures G5 and G6 are used together with gate electrode structure G7 receiving $\phi_1$ clock phase to scoop uniform charge quanta into box-car detecting circuitry, which converts the trains of charge pulses, developed responsive to successive input signal voltage $V_{IN}$ samples, to duration-modulated pulses in the PDM output voltage $V_{PDM}$.

The box-car detection circuitry of FIG. 1 includes the charge splitter-structure QS1, which receives the scooped charge quanta at the input of its bifurcated charge transfer channel over which extend gate electrode structures G9, G10 and G11. A first output of charge splitter structure QS1 is directly applied to a floating diffusion FD1, and a second output of charge splitter structure QS2 is delayed by additional four-phase clocking under gates G12 and G13 and then applied to a floating diffusion FD2.

The floating diffusion FD2 forms a virtual source region in a dual-gate FET structure further comprising a first gate electrode structure G14 biased from the output of sense/refresh circuit S/R, a second gate electrode structure G15 recurrently receiving a reset pulse $V_{R-2}$ on each clock cycle, and a drain region D1 baised to $V_{DD}$ potential. Sense/refresh circuit S/R at lower right of FIG. 1 comprises FET's T1, T2, T3, T4, T5, T6, T7, T8, T9, T10 and T11. When keying signal $\phi_L$ is high, as it is during $V_{R-1}$ pulse, sense/refresh circuit S/R compares the level of charge stored under floating diffusion FD1 against a reference charge level. Sense/refresh circuit S/R selectively applies a relatively negative potential to G14 to inhibit resetting of floating diffusion FD2 responsive to $V_{R-2}$ pulse on gate G15. Resettng is inhibited when the charge level on floating diffusion FD1 applied to one of its inputs exceeds a reference level charge, one-quarter so large as the quantum scoop charge, applied to the other of its inputs. When the charge level on floating diffusion FD1 does not exceed the reference level charge applied to the other of the inputs of sense/refresh circuit S/R, the circuit applies a relatively positive potential to G14 to permit resetting of floating diffusion FD2 responsive to $V_{R-1}$ pulse on G15.

Floating diffusion FD1 forms a virtual source region in a single-gate FET structure further comprising a gate electrode structure G16 receiving a reset pulse $V_{R-2}$ in each clock cycle and a drain region D2 biased to $V_{DD}$ potential. The potential on FD1 is a string of pulses following each admission of charge by fill-and-spill, input edges of the pulses being formed as long as charge can be scooped into the input of charge splitter circuit QS1, and output edges of the pulses being formed each time $V_{R-2}$ pulse is applied to G16. The potential on FD2 exhibits a single pulse following each admission of charge by fill-and-spill, lasting as long as charge can be scooped into the input of charge splitter QS1. This potential, applied to the gate of common-source amplifier FET T9, modulates the conduction of T9 drain current to provide $V_{PDM}$ output voltage across load element LE.

The second of the charge transfer devices, at bottom left of FIG. 1, comprises a source diffusion S2 supplying an infinite well of charge from which charge packets proportional to a unit-value reference level voltage $V_{REF}$ can be obtained by fill-and-spill. This second charge transfer device further comprises gate electrode structures G17, G18, G19, G20, G21, G22, G23, G24, G25, G26, G27, G28, G29; a floating diffusion FD3 at which voltage responsive to one-quarter standard quantum charge recurrently appears; a reset gate electrode structure G30 and a drain region D3.

Figure 2:
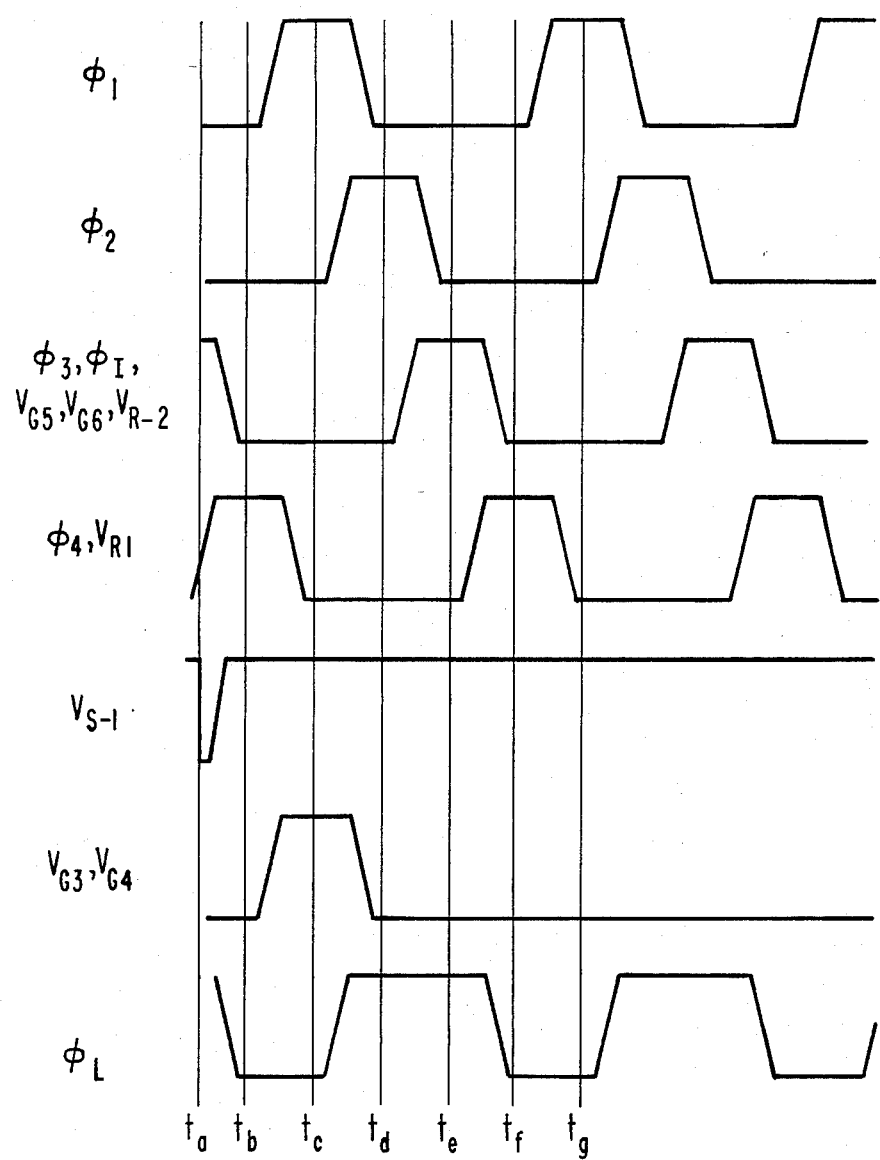
FIG. 2 is a timing diagram of the pulse waveforms supplied to the modulator by the clocking generator in the FIG. 1 pulse duration modulator.

FIG. 2 is a timing diagram of the clocking pulses applied by clocking generator CG to various points in the system just described. The times $t_a$, $t_b$, $t_c$, $t_d$, $t_e$, $t_f$ and $t_g$ are the successive times at which the events depicted in the (a), (b), (c), (d), (e), (f) and (g) portions of FIG. 3 respectively happen.

FIG. 3 comprises a series of energy level (or negative potential level) profiles occurring at successive times in the upper charge coupled device of FIG. 1 as a sample of analog voltage is converted to a train of pulses, the number of which pulses in the train is proportional to the amplitude of the analog voltage at the sampling time. The horizontal spatial coordinates of each profile are indicated by the source and gate structure shown in stylized form at the top of FIG. 3. A barrier height maintained under gate G1 by electrostatic induction responsive to a direct voltage $V_{DC}$ applied to this gate is constant as between successive profiles. $V_{DC}$ is indicated by dashed horizontal line in all portions of FIG. 3, so changes in potential levels in successive profiles can be more easily discerned.

Figure 3A:
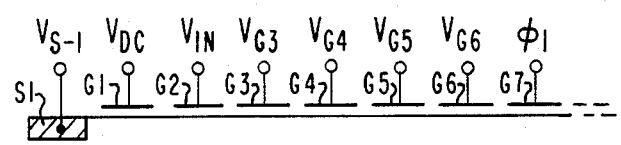

As shown in FIG. 3(a) during time $t_a$ a negative strobe voltage pulse lifts the energy level in the region under source diffusion S1, so that charge flows over the barrier height induced under gate G1 to flow into the energy well induced under input gate G2 responsive to $V_{IN}$ applied to this gate. The depth of this well below barrier height is linearly related to the amplitude of $V_{IN} - V_{DC}$.

Figure 3B:
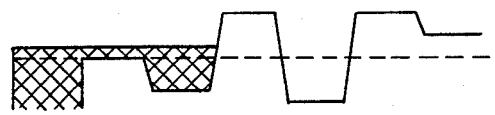

As shown in FIG. 3(b) at time $t_b$, when the negative strobe pulse $V_{S-1}$ is past, the charge that filled the well under gate G2 in excess of barrier height spills back to the source diffusion S1. The size of the charge sample left in the well under gate G2 by the fill-and-spill process just described is therefore a measure of $V_{IN} - V_{DC}$.

Figure 3C:
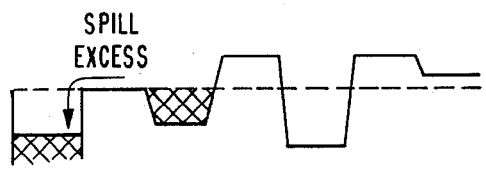

As shown in FIG. 3(c), at time $t_c$ the voltages $V_{G3}$ and $V_{G4}$ applied to transfer gate G3 and storage gate G4 are pulsed high. This lowers the barrier height under gate G3 so that the charge in the well under input gate G2 transfers to the deeper energy well under gate G4. This deeper well is a storage well providing a charge source for the charge scooping process which is to follow.

Figure 3D:
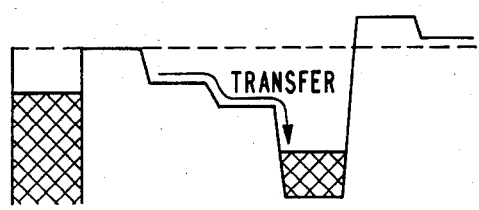

FIG. 3(d) shows the filled storage well at time $t_d$. While the gates G1, G2, G3, G4, G5, G6, G7 are shown as being of the same width at top of FIG. 3 and same general size in FIG. 1 electrical schematic, the wells induced under input gate G2 and under storage gate G4 in a practical CCD device have much larger charge storage capacity than the wells induced under those later gates involved in the charge scooping process and in the transfer of scooped charge pockets. So the areas of the gates G2 and G4 relative to the other gates will in actuality be much larger. (This will result in the negative potential well induced under these gates G2 and G4 changing very little in depth when a given amount of charge transfers in or out of them as compared to normally clocked gates G5, G6, G7 etc.)

Figure 3E:
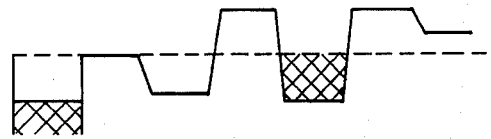
Figure 3F:
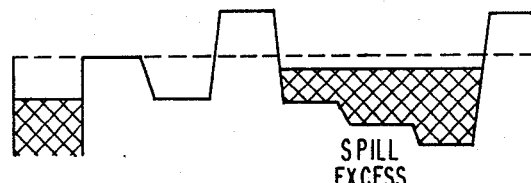
Figure 3G:
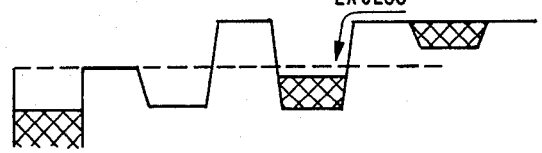

FIGS. 3(e), 3(f) and 3(g) show the first step of the charge scooping process, which process repeats until past the time the storage well under gate G4 is emptied. At time $t_e$ gate G5 is pulsed high to lower the energy barrier between storage gate G4 and gate G6, under which the scooping well is induced, which gate G6 is simultaneously pulsed high. The scooping well is filled to overflowing; and, when at time $t_f$ gates G5 and G6 return low, the excess filling spills back into the storage well under gate G4.

Then, at time $t_g$ gate G7, clocked in $\phi_1$ phase, goes low and the scooped charge transfers to under that gate. The transfered charge packet continues to be clocked forward in the CCD device in mid-FIG.-1 by normal 4-phase clocking procedure.

A train of pulses is supplied to the input of the charge splitter stage QS1 in FIG. 1, the number of pulses in the train being proportional to the amplitude of the last charge transferred to the storage well under gate G4 from the well under input gate G2. The signal processing which is to follow the charge scooping process involves box-car detecting the train of pulses to remove the intervals between them, and in this process resolving whether the last pulse in the train is to reckoned a logic ZERO or a logic ONE. Charge splitting in charge splitter QS1 allows resolving the last pulse to ZERO or to ONE to be completed during box car detection.

Half-signal charge packets from charge splitter QS1 are detected without additional delay at floating diffusion FD1 and are supplied to a sense/register circuit S/R. Each half-signal charge packet is compared in circuit S/R to a reference charge packet one-quarter so large as a full-size scooped charge. If the half-signal charge packet is as large as or larger than the reference charge packet, indicative that that pulse in the charge train should be resolved as a logic ONE, circuit S/R biases gate G14 low. If the half-signal charge packet is smaller than the reference charge packet, indicative that that pulse in the charge train should be resolved as a logic ZERO, circuit S/R biases gate G14 high.

The reference charge for circuit S/R is generated by successively halving in charge splitters QS2 and QS3 a full-size scooped charge. A source region S2 supplies the infinite charge source that continuously replenishes the storage well under gate G18—gates G17 and G18 being clocked like gates G3 and G4. Gates G19, G20 and G21 clocked like gates G5, G6 and G7 scoop charge packets into the input circuit of charge splitter QS2 which packets are the same size as fully filled "scoops" transferred by action of gates G5, G6 and G7.

The charge packets forwarded to floating diffusion FD3 by the cascade of charge splitters QS2 and QS3 are one-quarter so large. The unused outputs of charge splitters QS2 and QS3 connect to drains D4 and D5, respectively.

Floating diffusions FD2 and FD3 are reset in potential by clamping to $V_{DD}$ at drains D2 and D3, respectively, after each charge packet has been received and acted upon, the clamping being carried out by field effect transistor action as reset gates G16 and G30 receive a voltage $V_{R-1}$ pulsed high. Simultaneously, $\phi_L$ goes low to interupt conduction of T11 channel and consequently of the channels T3 and T4, and the channels of T9 and T11 are rendered conductive by $V_{R-1}$ at their gates being high, to clamp to $V_{SS}$ the internal nodes of sense/refresh circuit S/R at the gates of T5 and T7. These voltage resetting procedures take place during $\phi_4$ clock being high. In the next clock cycle when $\phi_3$ goes high, just before a charge packet is transferred under floating diffusion FD2, the charge packets under floating diffusions FD1 and FD3 are compared as $\phi_I$ goes high. If the charge packet under floating diffusion FD1 is larger than that under FD3, the gate of T3 will be more positive than the gate of T4; and the flip-flop connection of T1 and T2 will have been toggled to make T2 channel conductive and T1 channel non-conductive. T5 gate will be high and T5 channel will be conductive as T6 is biased for conduction by its gate being pulsed high by $\phi_I$ going high. T5 will pull gate G14 potential towards $V_{SS}$, overcoming the tendency for T6 conduction to lift gate G14 towards the positive $V_{DD}$ potential at the drain of T6 and inhibiting the resetting of floating diffusion FD2. On the other hand, if the charge packet under floating diffussion FD1 is smaller than that under floating diffusion FD3, as will occur at the conclusion of the pulse train clocked to FD1, the gate of T4 will be more positive than that of T3. The flip-flop connection of T1 and T2 will be toggled to make T2 conductive and T1 conductive. The gate of T5 will be clamped to $V_{SS}$ by conduction of T2, and the channel of T5 will be non-conductive. Conduction of T6 when $\phi_I$ at its gate goes high will lift gate G14 to positive $V_D$ potential, so it no longer inhibits resetting of floating diffusion FD2 to $V_{DD}$.

The channels of T5 and T6 are preferably proportioned so that the rise of gate G14 to $V_D$ is prevented even when the flip-flop connection of T1 and T2 is in unstable equilibrium at its toggle point. T7 and T8 are used to balance the loading on the flip-flop connection of T1 and T2 with the loading imposed by T5 and T6.

Charge packets supplied by the other output of charge splitter QS1, rather than that output supplying charge to floating diffusion FD1, are subjected to additional delay under gates G12 and G13 before being clocked under a floating diffusion FD2, which connects to the gate of output FET T12. As noted above, floating diffusion FD2 will be reset in potential by clamping to $V_{DD}$ at drain D1 between charge packets in the pulse train being clocked forwarded to it, when clamp is established by field effect transistor action caused by gate G15 receiving a voltage $V_{R-2}$ that is pulsed high, except when gate G14 is biased low by sense/refresh circuit S/R. G14 is biased low until the last pulse of the train which exceeds one-half logic ONE is by. Then G14 is biased high and floating diffusion FD2 can be reset by being clamped to $V_{DD}$ by gate G15 being pulsed high. (That is, gates G14 and G15 control dual-gate FET action between floating diffusion FD2, as virtual source, and drain D1.) So, by preventing resetting of floating diffusion FD1, the voltage on floating diffusion FD2 and thus on the gate of output FET T9 remains low throughout the pulse train, so long as its pulses are resolved as logic ONEs, to box-car detect the train.

What is claimed is:

1. In combination:
   means recurrently sampling an analog input signal voltage for generating pulse-amplitude-modulated (PAM) charge packets;
   means for storing each succeeding PAM charge packet until the next is generated;
   means operative between generating successive PAM charge packets for removing at a time-invariant rate quanta of charge from said stored charge packet, each quantum equal to a standard decrement of charge so long as said stored charge packet is not depleted; and
   means for box-car detecting each train of charge pulses generated by the successively removed charge quanta to obtain a respective duration-modulated pulse component of a pulse-duration-modulated (PDM) signal.

2. A combination as set forth in claim 1 wherein said means for box-car detecting comprises:
   a charge-coupled device for developing relatively non-delayed and delayed responses to said removed quanta of charge at first and second floating diffusions thereof, said first floating diffusion having a first reset gate electrode separating it from a first drain connection, and said second floating diffusion having a reset-inhibit gate electrode and a second reset gate electrode separating it from a second drain connection;
   a field effect transistor switching, in response to potential applied to its gate electrode from said second floating diffusion, to generate said PDM signal in its source-to-drain circuit;
   means applying reset signals to said first reset gate electrodes at times after each removed charge quantum has been clocked to said first floating diffusion, for clamping said first floating diffusion to said first drain connection; and
   means applying reset signals to said second reset gate electrodes at times after each removal charge quantum has been clocked to said second floating diffusion, for clamping said second floating diffusion to said second drain connection; and
   means, responding to the potential on said first floating diffusion being indicative that the charge thereunder exceeds half the portion of standard decrement of charge expected thereunder, for applying a potential to said reset-inhibit gate electrode that inhibits resetting said second floating diffusion, and, responding to the potential on said first floating diffusion being indicative that charge thereunder does not exceed half the portion of standard decrement of charge expected thereunder, for applying a potential to said reset-inhibit gate electrode that permits resetting said second floating diffusion.

3. A combination as set forth in claim 1 wherein said means for box-car detecting comprises:
   means for generating charge transfer clocking voltages;
   a charge-coupled device charge-splitter having an input to which said removed charge quanta are supplied, having first and second outputs, having a bifurcated charge transfer channel connecting its input to its first and second outputs, and having gate electrodes over its charge transfer channel for receiving said charge transfer clocking voltages;
   a first charge transfer channel having charge supplied to its input from the first output of said charge splitter and having at its output a floating diffusion preceded by number m of gate electrodes for receiving charge transfer clocking voltages and followed in turn by a reset gate electrode and by a drain connection;
   a second charge transfer channel having charge supplied to its input from the second output of said charge splitter and having at its output a floating diffusion preceded by a number n greater than m of gate electrodes for receiving charge transfer clocking voltages and followed by a reset-inhibit gate electrode and a reset gate electrode, and then by a drain connection;
   a field effect transistor switching, in response to potential applied to its gate electrode from the floating diffusion of said second charge transfer channel, to generate said PDM signal in its source-to-drain circuit;
   means applying reset signals to the reset gate electrodes of said first and second charge transfer channels at times after removed charge quanta have been clocked to their respective floating diffusions, for clamping the floating diffusions of the first and second charge transfer channels to their respective drain connections; and means, responding to the potential on the floating diffusion of said first charge transfer channel being indicative that the charge thereunder exceeds half the portion of standard decrement of charge expected thereunder, for applying a potential to said reset-inhibit gate electrode that inhibits resetting the preceding floating diffusion, and, responding to the potential on the floating diffusion of said first charge transfer channel being indicative that charge thereunder does not exceed half the portion of standard decrement of charge expected thereunder, for applying a potential to said reset-inhibit gate electrode that permits resetting the preceding floating diffusion.

4. A method for generating box-car detection response to groups of cyclically recurring pulses with uniform spacings between adjacent pulses, comprising the steps of:

delaying said pulse groups by a portion of the recurring cycle;

peak detecting the resulting delayed pulse groups with resettable means for peak detecting;

resetting said means for peak detecting in the spacings between adjacent ones of the delayed pulses unless an inhibiting signal is received; and comparing said pulse groups to a reference level for generating said inhibitory signal, whereby said box-car detection response is supplied from said resettable means for peak detecting.

5. Box-car detection circuitry for charge-coupled-device apparatus comprising:

a charge-splitter having a source connection for receiving groups of regularly recurring pulses and having first and second drain connections;

first and second charge-coupled devices having respective source connections from the first and second outputs of said charge splitter, having respective floating diffusions at relatively long and relatively short time delay positions, having respective drain connections and having respective reset gate electrodes, the reset gate electrode of each of said first and second charge-coupled devices being disposed between its floating diffusion and its drain connection, said first charge coupled device having an inhibit gate electrode between its reset electrode and one of its floating diffusion and its drain connection;

a comparator for comparing the potential on the floating diffusion of said second charge-coupled device against a reference potential to generate an inhibit signal applied to said inhibit gate electrode;

an insulated-gate field effect transistor, with a gate electrode to which the potential on said floating diffusion is applied, and with source and drain; and means connecting to the source and drain of said insulated-gate field effect for arranging its operation as a common-source amplifier from which box-car detection response to said regularly recurring pulses is provided.

6. A pulse-amplitude-modulation to pulse-duration-modulation converter comprising:

a semiconductive substrate;

an insulating layer disposed on said semiconductive substrate, having a first surface adjoining the semiconductive substrate and having a second surface opposing said first surface;

a source region disposed in said semiconductive substrate, ohmically contacted and connected to receive a reference voltage;

a first drain region disposed in said semiconductive substrate near said source region, ohmically contacted, and connected to receive an operating voltage via a direct-current conductive load impedance across which pulse-duration-modulated output signals are to be taken;

a first gate electrode structure on the second surface of said insulating layer for forming an insulated-gate field effect transistor in combination with said source region and said first drain region;

a first charge transfer channel disposed in said semiconductive substrate;

a second drain region disposed in said semiconductive substrate at the end of said first charge transfer channel, ohmically connected, and connected to receive a drain voltage;

a first floating diffusion arranged for sensing charge at a location along said first charge transfer channel;

second and third gate electrodes arranged on the second surface of said insulating layer and over said first charge transfer channel between said first floating diffusion and said second drain region;

means for applying the potential appearing in said floating diffusion to said first gate electrode structure;

means for generating charge-coupled-device clocking signals in a plurality of phases with a recurrence rate substantially in excess of the pulse repetition rate of the pulse-amplitude-modulated input signal;

means responsive to each pulse in said pulse-amplitude-modulated input signal for establishing a charge store proportional to the amplitude of the pulse in a depletion region in said semiconductive subtrate;

means for transferring a fixed amount of charge on each clocking signal cycle from said charge store so long as said charge store is not completely depleted;

means for applying a predetermined amount of the transferred charge to the beginning of said first charge transfer channel;

a first plurality of further gate electrodes, being receptive of said clocking signal phases for moving the applied charge to be under said floating diffusion;

means for generating a reset pulse at the close of each cycle of clocking signal;

means applying said reset pulse to said third gate electrode for causing a tendency to clamp said first floating diffusion to said second drain region by field effect transistor action; and means responsive to whether or not the charge to be moved under said floating diffusion exceeds a threshold size to generate a inhibitory signal which is applied to said second gate electrode to inhibit said tendency to clamp said first floating diffusion to said second drain region if said threshold size be exceeded.

7. A pulse-amplitude-modulation to pulse-duration-modulation converter as set forth in claim 6 wherein said means for applying a predetermined amount of the transferred charge to the beginning of said first transfer channel comprises:

a charge-coupled-device charge splitter dividing said transferred charge into a first portion applied to the beginning of said first charge transfer channel and into a second portion.

8. A pulse-amplitude-modulation to pulse-duration-modulation converter as set forth in claim 7 wherein said means responsive to whether or not the charge to be moved under said floating diffusion exceeds a threshold size comprises:

a second charge transfer channel disposed in said semiconductor substrate connected at its beginning to receive the second portion of transferred charge from said charge splitter;

a third drain region disposed in said semiconductive substrate at the end of said second charge transfer channel;

a second floating diffusion arranged for sensing charge at a location along said second charge transfer channel;

a second plurality of further gate electrodes being fewer in number than said first plurality of further gate electrodes, and being receptive of said clocking signal phases for moving said second portion of transferred charge along said second charge transfer channel from its beginning to under said second floating diffusion;

a still further gate electrode, being disposed on the second surface of said insulating layer over said second charge transfer channel between said second floating diffusion and said third drain region, and having said reset pulses applied thereto; and comparator means comparing the size of the charge moved under said second floating diffusion with said threshold size for generating said inhibitory signal.

9. In combination:

a charge transfer channel having first and second ends;

a drain region terminating the second end of said charge transfer channel;

a reset gate electrode overlying said charge transfer channel near its second end;

a further gate electrode overlying said charge transfer channel on the side of said reset gate electrode opposite said drain region;

a floating diffusion in said charge transfer channel providing a virtual source region for a dual-gate, insulated-gate field effect transistor comprised in the aforeclaimed elements;

another insulated gate field effect transistor;

means for connecting said other insulated gate field effect transistor in common-source-amplifier configuration including means for applying the potential on said floating diffusion to its gate electrode;

a succession of still further gate electrodes overlying said charge transfer channel between its first end and said floating diffusion region;

a source of cyclic clocking signals applied to said still further gate electrodes in appropriate order for transporting packets of charge down said charge transfer channel from its first end to said floating diffusion;

a source of reset signal pulses applied to said reset gate electrode for causing a tendency for said dual-gate, insulated-gate field effect transistor to clamp said floating diffusion to said drain region during a portion of the cycle of said clocking signals;

a source of inhibit signal pulses selectively applied to said further gate electrode contemporaneously with ones of said reset signal pulses for inhibiting said tendency for said dual-gate, insulated-gate field effect transistor to clamp said floating diffusion to said drain region.

* * * * *